United States Patent
Park

(10) Patent No.: US 7,889,567 B2
(45) Date of Patent: Feb. 15, 2011

(54) NONVOLATILE MEMORY DEVICE FOR PREVENTING PROGRAM DISTURBANCE AND METHOD OF PROGRAMMING THE NONVOLATILE MEMORY DEVICE

(75) Inventor: Jong-Yeol Park, Goyang-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 100 days.

(21) Appl. No.: 12/335,099

(22) Filed: Dec. 15, 2008

(65) Prior Publication Data

US 2010/0002522 A1    Jan. 7, 2010

(30) Foreign Application Priority Data

Jul. 4, 2008    (KR)    ...................... 10-2008-0065141

(51) Int. Cl.
*G11C 11/34* (2006.01)
*G11C 16/06* (2006.01)
(52) U.S. Cl. .............................. 365/185.23; 365/185.17
(58) Field of Classification Search ............ 365/185.23, 365/185.17, 185.22
See application file for complete search history.

(56) References Cited

U.S. PATENT DOCUMENTS 5,815,458 A * 9/1998 Chevallier et al. ...... 365/230.06
6,747,908 B2 * 6/2004 Lee et al. ................ 365/230.03
6,859,397 B2   2/2005 Lutze et al.
7,609,549 B2 * 10/2009 Aritome ................. 365/185.03
7,746,707 B2 * 6/2010 Tanaka et al. ............ 365/185.3

FOREIGN PATENT DOCUMENTS

JP    2000-243094    9/2000
KR   1020020054511    7/2002

OTHER PUBLICATIONS

English Abstract for Publication No.: 2000-243094.
English Abstract for Publication No.: 1020020054511.

* cited by examiner

*Primary Examiner*—Anh Phung
(74) *Attorney, Agent, or Firm*—F. Chau & Associates, LLC

(57) ABSTRACT

A nonvolatile memory device for preventing program disturbances includes a memory cell array block, a word line driver, and a well bias control unit. The memory cell array block includes at least one cell string having a plurality of memory cells serially connected to a bit line and alternately connected to even word lines and odd word lines. After a program verification, the word line driver drives the even word lines with a first voltage and then the odd word lines with the first voltage to drop the even word line to a voltage lower than the first voltage. The well bias control unit floats a bias of a p-well formed by high voltage NMOS transistors that apply corresponding driving voltages to the even word lines and the odd word lines according to an operation mode of a program operation, a read operation, and an erase operation.

10 Claims, 4 Drawing Sheets

NONVOLATILE MEMORY DEVICE FOR PREVENTING PROGRAM DISTURBANCE AND METHOD OF PROGRAMMING THE NONVOLATILE MEMORY DEVICE

CROSS-REFERENCE TO RELATED APPLICATIONS

This application claims priority to Korean Patent Application No. 10-2008-0065141, filed on Jul. 4, 2008, in the Korean Intellectual Property Office, the disclosure of which is incorporated herein in its entirety by reference.

BACKGROUND OF THE INVENTION

1. Technical Field

The present invention relates to a nonvolatile memory device, and more particularly, to a nonvolatile memory device for preventing a program disturbance and a method of programming the nonvolatile memory device.

2. Discussion of the Related Art

Flash memory devices are useful as auxiliary memory devices for portable devices because of their long data retention, low power consumption, and high impact durability. Flash memory devices may store data in a series of cells as electronic charges within a potential barrier. Programming of a memory cell may include injection of electrons into a potential barrier or tunneling of elections into the potential barrier. Erasure of the memory cell may be implemented by electron tunneling.

In particular, NAND flash memory devices in which a predetermined number of memory cells are connected in series are more useful as auxiliary memory devices for high capacity portable devices because of their smaller cell size and higher degree of integration than NOR flash memory devices in which memory cells are connected in parallel.

In NAND flash memory, memory cells may be organized in strings, pages, and blocks. A string is made up of plurality of memory cells serially connected to one bit line. A page consists of a group of memory cells connected to one word line. Each block of memory cells includes a plurality of pages. In such NAND flash memory devices configured as described above, reading and programming are performed on a page basis. Accordingly, no less than one full page of memory cells may be read or programmed. Erasure of the memory cells is performed on a block basis and thus no less than one full block of memory cells may be erased.

FIG. 1 is a circuit diagram illustrating a voltage applied during a program operation of a conventional NAND flash memory device. Referring to FIG. 1, a memory cell array 100 includes first and second memory strings A0 and A1 in which memory cells are connected to common word lines WL0 through WLn. The first memory string A0 is connected to a first bit line BL0, and the second memory string A1 is connected to a second bit line BL1. In the first memory string A0, memory cell transistors MT0A through MTnA have floating gates and are serially connected. A drain of the memory cell transistor MT0A is connected to the first bit line BL0 through a string selection transistor SG1A connected to a string selection line SSL. A source of the memory cell transistor MTiA is connected to a ground voltage VSS through a ground selection transistor SG2A connected to a ground selection line GSL. In the second memory string A1, memory cell transistors MT0B through MTnB have floating gates and are serially connected. A drain of the memory cell transistor MT0B is connected to the second bit line BL1 through a string selection transistor SG1B. A source of the memory cell transistor MTnB is connected to a ground voltage VSS through a ground selection transistor SG2B.

A program operation of a flash memory that occurs after an erase operation is performed as follows. It may be assumed that the memory cell transistor MTiA of the first memory string A0 is the flash memory cell to be programmed. A voltage of 0 V is applied to the first bit line BL0 and the string selection transistor SG1A is turned on, the first memory string A0 is connected to the first bit line BL0 and the string selection transistor SG2A is turned off. A program voltage Vpgm of, for example, 14 to 20 V, is applied to the selected word line WLi, and a pass voltage Vpass of, for example, 7 to 10 V, is applied to the non-selected word lines WL0 through WLn. Accordingly, electrons of the memory cell transistor MTiA are tunneled from a channel to the floating gate, thereby shifting a threshold voltage of the memory cell transistor MTiA to a positive voltage.

Since the program operation is performed on a page basis, if the program voltage Vpgm is applied to the word line WLi, the same program voltage Vpgm is also applied to the gate of the memory cell transistor MTiB that is part of the second memory string A1 even though the second memory string A1 has not been selected. Accordingly, in one page, the memory cell transistor MTiA which is to be programmed and the memory cell transistor MTiB (referred to as program inhibit cell) which is not to be programmed are connected to one word line WLi, and thus the program voltage Vpgm is applied to all cells that are connected to the selected word line WLi. As a result, the program inhibit cell of the memory cell transistor MTiB may be soft programmed due to the program voltage Vpgm, thereby causing a program disturbance.

In order to prevent the program disturbance of the program inhibit cell of the memory cell transistor MTiB, attempts have been made to reduce the program voltage Vpgm applied to the selected word line WLi or to increase a channel voltage. Since the attempt to reduce the program voltage Vpgm is greatly dependent on the characteristics of the program inhibit cell of the memory cell transistor MTiB, it may not be practical to reduce the program voltage Vpgm applied to the selected word lime WLi. The channel voltage may, however, be increased by applying a power voltage VDD to the second bit line BL1 using self-boosting by a capacitive coupling between the gate and the channel.

Alternatively, the channel voltage may be increased due to the self-boosting by the capacitive coupling between the gate and the channel by increasing the magnitude of change in a voltage applied to the selected word line WLi. Accordingly, there is a demand for a method of increasing the magnitude of change in the voltage applied to the selected word line WLi.

SUMMARY OF THE INVENTION

Exemplary embodiments of the inventive concept provide nonvolatile memory devices for reducing or preventing the occurrence of program disturbances by increasing the magnitude of change in a voltage applied to a word line.

Exemplary embodiments of the inventive concept also provide methods of programming the nonvolatile memory devices.

According to an aspect of the inventive concept, a nonvolatile memory device includes a memory cell array block having at least one cell string. A plurality of memory cells of each cell string are serially connected to a bit line and are alternately connected to even word lines and odd word lines. A word line driver, after a program verification read step has been performed on the memory cells, drives the even word lines with a first voltage and then driving the odd word lines with the first voltage and drops the even word lines to a voltage that is lower than the first voltage. The first voltage may be a ground voltage.

The nonvolatile memory device may further include a pass transistor unit having high voltage NMOS transistors that apply corresponding driving voltages to the even word lines and the odd word lines during corresponding operation modes of a program operation, a read operation, or an erase operation. The nonvolatile memory device may also include a well bias control unit that floats a bias of a p-well formed by the high voltage NMOS transistors after the odd word lines are driven by the first voltage during a program verification read step.

The well bias control unit may bias the p-well formed by the high voltage NMOS transistors to a ground voltage during the operation mode of the program operation, the read operation, or the erase operation.

If it is not determined that a selected memory cell is correctly programmed in the program verification read step performed on the memory cells, the word line driver may drive a word line of the selected memory cell with a program voltage.

According to another aspect of the inventive concept, there is provided a nonvolatile memory device that includes a memory cell array block having at least one cell string in which a plurality of memory cells are serially connected to a bit line and are sequentially connected to a first word line, a second word line, and a third word line constituting a word line unit. A word line driver, in a program verification read step performed on the memory cells, sequentially drives the first word line with a first voltage, the second word line with the first voltage, and the third word line with the first voltage. The second word line is dropped to a voltage that is lower than the first voltage and the first word line is dropped to a voltage that is lower than the voltage of the second word line.

According to an aspect of the inventive concept, there is provided a method of programming a selected memory cell of a memory cell array of a nonvolatile memory device in which a plurality of memory cells serially connected to a bit line constitute at least one cell string and are alternately connected to even word lines and odd word lines. The method includes driving, in a current program loop, a word line of the selected memory cell with a first program voltage. It is determined whether the selected memory cell is correctly programmed. The even word lines are driven with a first voltage and then the odd word lines are driven with the first voltage. If it is not determined that the selected memory cell is correctly programmed, then the word line of the selected memory cell is driven with a second program voltage in a next program loop.

The second program voltage may be higher than the first program voltage.

According to another aspect of the inventive concept, there is provided a method of programming a selected memory cell of a memory cell array of a nonvolatile memory device. In the nonvolatile memory device, a plurality of memory cells are serially connected to a bit line and form at least one cell string. The cells are sequentially connected to a first word line, a second word line, and a third word line constituting a word line unit. The method includes driving, in a current program loop, a word line of the selected memory cell with a first program voltage. It is determined whether the selected memory cell is correctly programmed. The first word line is driven with a first voltage, the second word line is then driven with the first voltage, and then the third word line is driven with the first voltage. If it is not determined that the selected memory cell is correctly programmed, the word line of the selected memory cell is driven with a second program voltage in a next program loop.

According to an exemplary embodiment of the present inventive concept, a word line of program inhibit cells may exhibit a change in voltage equal to the sum of a conventional increase of voltage associated with the program inhibit cells and the difference between a program voltage and a ground voltage. This increase may be due to a coupling between adjacent word lines. Accordingly, a channel voltage of the program inhibit cells is increased, thereby preventing a program disturbance of the program inhibit cells.

Also, due to a double coupling between adjacent word lines, the word line of program inhibit cells may exhibit an additional increase in voltage, thereby preventing a program disturbance of the program inhibit cells.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
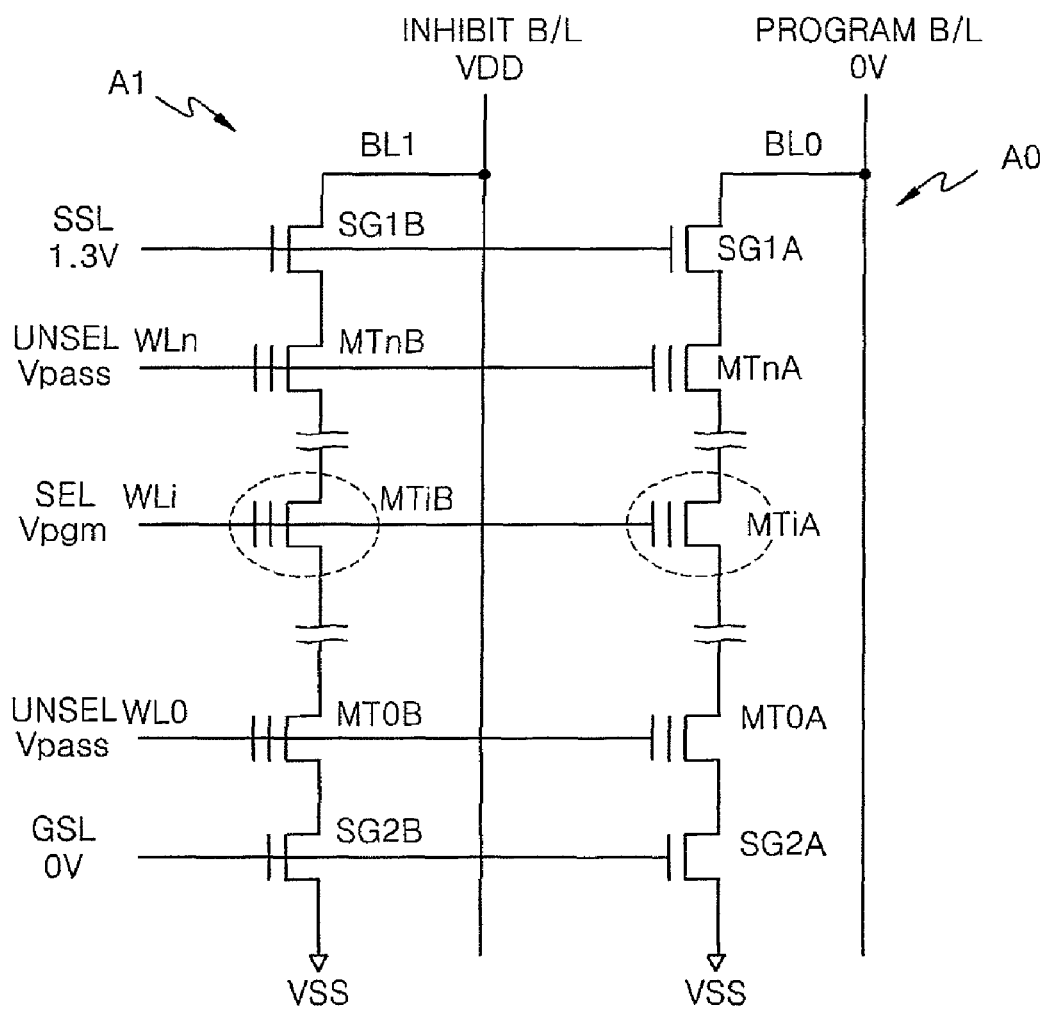
FIG. 1 is a circuit diagram illustrating a voltage applied during a program operation of a conventional NAND flash memory device.

Exemplary embodiments of the inventive concept will be described in detail with reference to the attached drawings.

Exemplary embodiments of the inventive concept will now be described more fully with reference to the accompanying drawings. In the drawings, like reference numerals may denote like elements.

Figure 2:
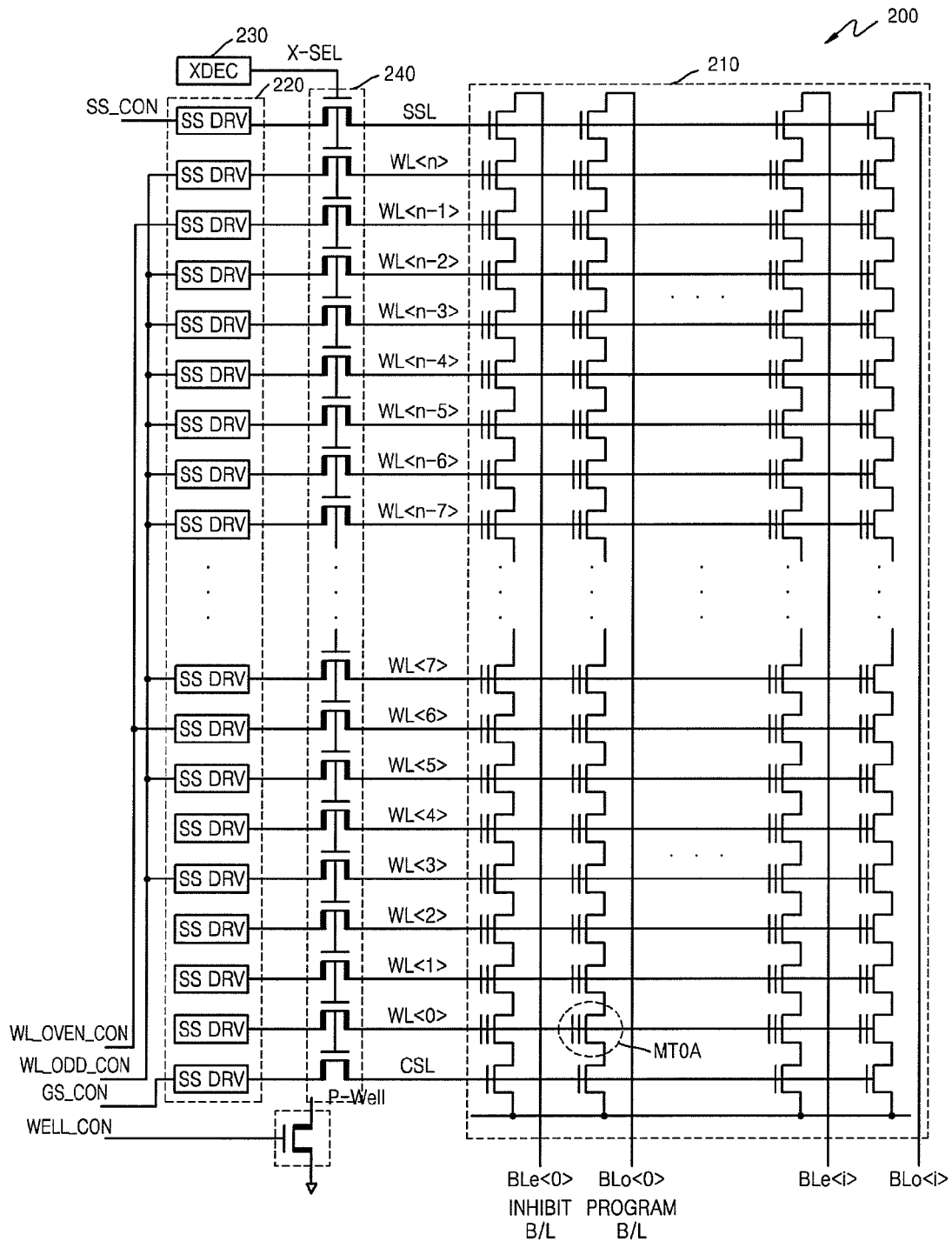
FIG. 2 is a circuit diagram for explaining a NAND flash memory device according to an exemplary embodiment of the inventive concept.

FIG. 2 is a circuit diagram for explaining a NAND flash memory device 200 according to an exemplary embodiment of the inventive concept. Referring to FIG. 2, the NAND flash memory device 200 includes a memory cell array block 210, a word line driver unit 220, a row decoder 230, and a pass transistor unit 240.

In the memory cell array block 210, a plurality of memory cells that are connected in series to one bit line BLe<i> or BLo<i> (where i is a natural number) constitute one string. A page consists of a group of memory cells connected to one word line WL<i> ($0 \leq i \leq n$). A memory cell array is divided into blocks each including a plurality of pages. In the NAND flash memory device 200 configured, for example, as described above, each of a read operation and a program operation is performed on one full page at a time and an erase operation is performed on one full block at a time.

The word line driver unit 220 includes word line drivers WL DRV connected to word lines WL<i>, a string selection line driver SS DRV connected to a string selection line SSL, and a ground selection line driver GS DRV connected to a ground selection line GSL. The word line driver unit 220 provides driving voltages, such as a program voltage Vpgm, a read voltage Vread, a pass voltage Vpass, and an erase voltage Verase supplied by a high voltage generating circuit (not shown) under the control of a write/read controller (not shown) of the NAND flash memory device 200 to the word lines WL<i>, the string selection line SSL, and the ground selection line GSL through the word line drivers WL DRV, the string selection line driver SS DRV, and the ground selection line driver GS DRV, respectively.

The word line driver unit 220 selects one word line from among the word lines WL<i> according to address information, and provides driving voltages according to operation modes to the selected word line, non-selected word lines, the string selection line SSL, and the ground selection line GSL.

In FIG. 2, it is assumed that a memory cell transistor MT0A in the memory cell array block 210 is to be programmed. During a program operation mode, a program voltage Vpgm of, for example, about 18 V, is applied to a selected word line WL<0> and a pass voltage Vpass of, for example, about 10 V, is applied to non-selected word lines WL<1> through WL<n>. Also, a power voltage VDD of for example, about 3 V, is applied to the string selection line SSL and a ground voltage VSS is applied to the ground selection line GSL. During a read operation mode, a ground voltage VSS is applied to the selected word line WL<0> and a read voltage Vread of, for example, about 4.5 V, is applied to the non-selected word lines WL<1> through WL<n>, the string selection line SSL, and the ground selection line GSL. The program voltage Vpgm, the pass voltage Vpass, and the read voltage Vread are high voltages greater than the power voltage VDD.

A high voltage greater than the power voltage VDD is provided to the word lines WL<0> through WL<n>, the string selection line SSL, and the ground selection line GSL, by generating a block word line signal X_SEL of a high voltage in the row decoder 230 which can switch the high voltage. The pass transistor unit 240 is turned on in response to the block word line signal X_SEL provided by the row decoder 230 and applies the program voltage Vpgm, the pass voltage Vpass, and the read voltage Vread provided by the word line driver unit 220 to the selected word line WL<0>, the non-selected word lines WL<1> through WL<n>, the string selection line SSL, and the ground selection line GSL of the memory cell array block 210.

The pass transistor unit 240 is controlled by the block word line signal X_SEL, and includes high voltage NMOS transistors connected between the word lines WL<i> and the drivers of the word line driver unit 220. The high voltage NMOS transistors are formed in a P-well during a semiconductor manufacturing process. The P-well is biased to a ground voltage VSS in response to a well bias control signal WELL_CON.

The word line driver unit 220 prevents or reduces the occurrence of disturbances by increasing the magnitude of change in voltage of the word lines WL<i>. A method of applying a word line voltage is performed after dividing the word lines WL<i> into even word lines and odd word lines. For example, word line drivers WL DRV connected to the even word lines are driven by a word line control signal WL_EVEN_CON, and word line drivers WL DRV connected to the odd word lines are driven by an odd word line control signal WL_ODD_CON.

Figure 3:
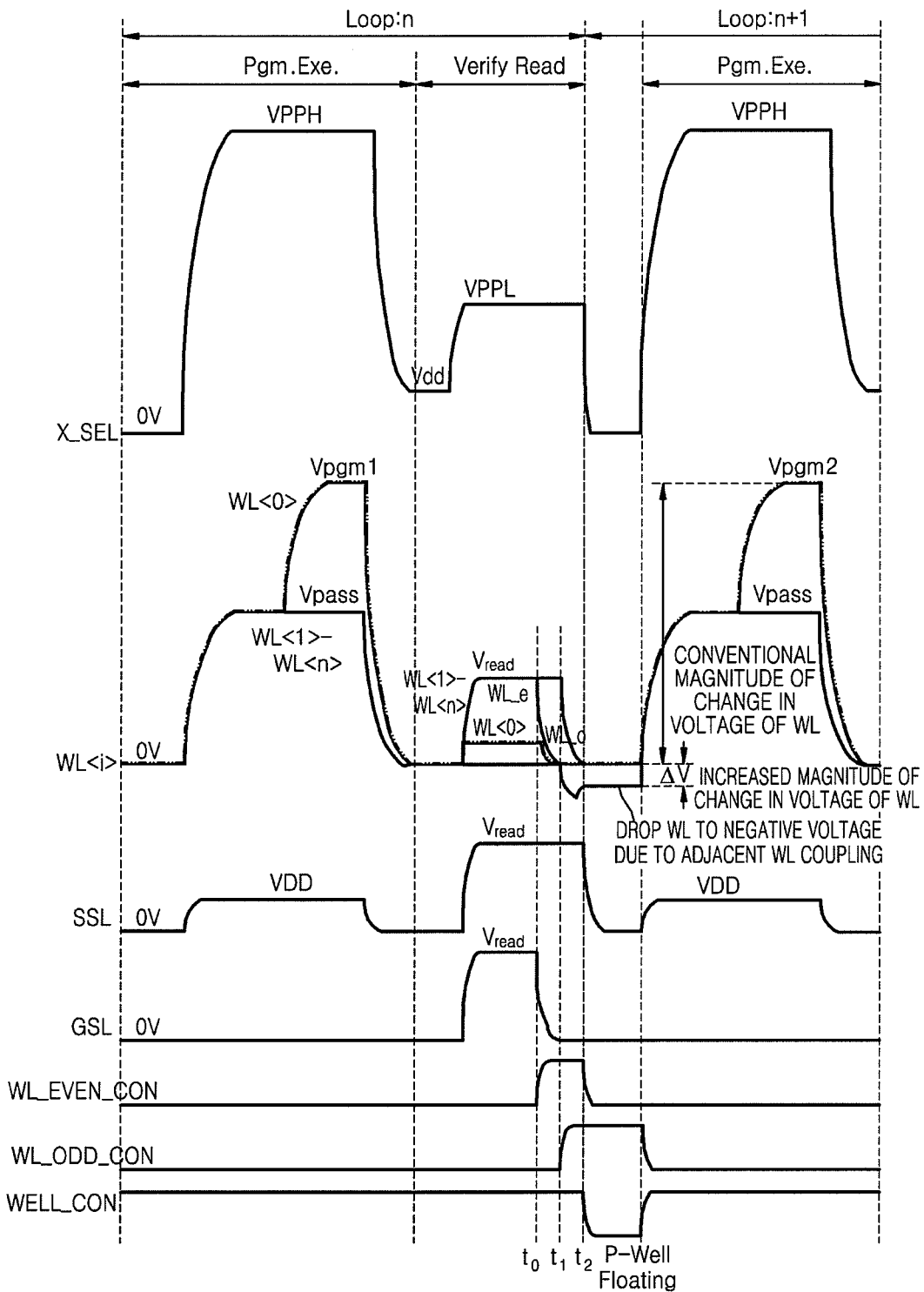
FIG. 3 is a timing diagram for explaining a method of applying a word line voltage during a program operation of the NAND flash memory device of FIG. 2, according to an exemplary embodiment of the inventive concept.

FIG. 3 is a timing diagram illustrating a method of applying voltage to a word line during a program operation of the NAND flash memory device 200 of FIG. 2, according to an exemplary embodiment of the inventive concept. In FIG. 3, a program loop is divided into a current program loop Loop:n and a next program loop:n+1. The current program loop Loop:n includes a program step Pgm.Exe in which the memory cells are programmed, and a verify and read step Verify Read in which it is determined whether a predetermined memory cell is correctly programmed.

In the program step Pgm.Exe, a voltage of 0 V is applied to the bit line BLo<0>, and the block word line signal X_SEL is activated from a ground voltage VSS to a first high voltage VPPH and the pass transistor unit 240 is turned on. The string selection line SSL is boosted from a ground voltage VSS to a power voltage VDD, and the ground selection line GSL is supplied with a ground voltage VSS. Next, the non-selected word lines WL<1> through WL<n> are boosted from a ground voltage VSS to a pass voltage Vpass, and the selected word line WL<0> is boosted from the ground voltage VSS to a program voltage Vpgm1 through the pass voltage Vpass. Accordingly, the memory cell MT0A connected to the selected word line WL<0> is programmed.

In the program step Pgm.Exe, the even word line control signal WL_EVEN_CON and the odd word line control signal WL_ODD_CON are inactive, and the well bias control signal WELL_CON is activated such that the P-well of the pass transistor unit 240 is biased to a ground voltage VSS. After the program step Pgm.Exe ends, the block word line signal X_SEL is supplied with a power voltage VDD, and the word lines WL<i>, the string selection line SSL, and the ground selection line GSL are supplied with a ground voltage VSS.

In the verify and read step Verify Read, the block word line signal X_SEL is supplied with a second high voltage VPPL that is lower than the first high voltage VPPH, the non-selected word lines WL<1> through WL<n>, the string selection line SSL, and the ground selection line GSL are supplied with a read voltage Vread, and the selected word line WL<0> is supplied with a predetermined voltage of, for example, about 1.3 V.

Next, at time $t_0$, a ground voltage VSS is applied to the even word lines WL_e from among the non-selected word lines WL<1> through WL<n> in response to activation of the even word line control signal WL_EVEN_CON, and a ground voltage VSS is applied to the selected word line WL<0> and the ground selection line GSL.

At time $t_1$, a ground voltage VSS is applied to the odd word lines WL_o from among the non-selected word lines WL<1> through WL<n> in response to activation of the odd word line control signal WL_ODD_CON. The even word lines WL_e adjacent to the odd word lines WL_o are dropped to a negative voltage that is lower than a ground voltage VSS due to a coupling. The even word lines WL_e are respectively connected to N+ junctions in the P-well of the high voltage NMOS transistors of the pass transistor unit 240. The P-well of the pass transistor unit 240 is biased to a ground voltage VSS. Accordingly, although the even word lines WL_e are dropped to the negative voltage, since a forward threshold voltage Vth is applied between the P-well and an the N+ junctions in the pass transistor unit 240, the even word lines WL_e are limited to a voltage, e.g., about −0.7 V, which is lower by the forward threshold voltage Vth than the ground voltage VSS of the P-well.

At time $t_2$ when the verify and read step Verify Read of the current program loop Loop:n ends and the next program loop Loop:n+1 starts, the block word line signal X_SEL is supplied with a ground voltage VSS, the string selection line SSL is supplied with a ground voltage VSS, and the even word line control signal WL_EVEN_CON is inactivated. The well bias control signal WELL_CON is inactivated and the P-well of the pass transistor unit 240 is floated. As the P-well of the pass transistor unit 240 is floated, the even word lines WL_e that are limited to a negative threshold voltage Vth at time $t_1$ are coupled to the odd word lines WL_o supplied with the ground voltage VSS, and thus are dropped to a negative voltage that is lower than the negative threshold voltage Vth.

If the memory cell MT0A is not sufficiently programmed, in a program step Pgm.Exe of the next program loop Loop: n+1, a pass voltage Vpass is applied to the non-selected word lines WL<1> through WL<n>, and a program voltage Vpgm2 that is higher than the program voltage Vpgm1 of the previous program loop Loop:n is applied to the selected word line WL<0>. Accordingly, the memory cell MT0A connected to the selected word line WL<0> is programmed again.

With respect to the program inhibit cells that are connected to the selected word line WL<0>, the word line of the program inhibit cells may exhibit a change in voltage equal to the sum of a conventional increase of voltage associated with the program inhibit cells and the difference between a program voltage and a ground voltage. The word line WL<0> of the program inhibit cells having a high voltage change, thereby increases a channel voltage of the program inhibit cells and thus a program disturbance of the program inhibit cells may be prevented.

Figure 4:
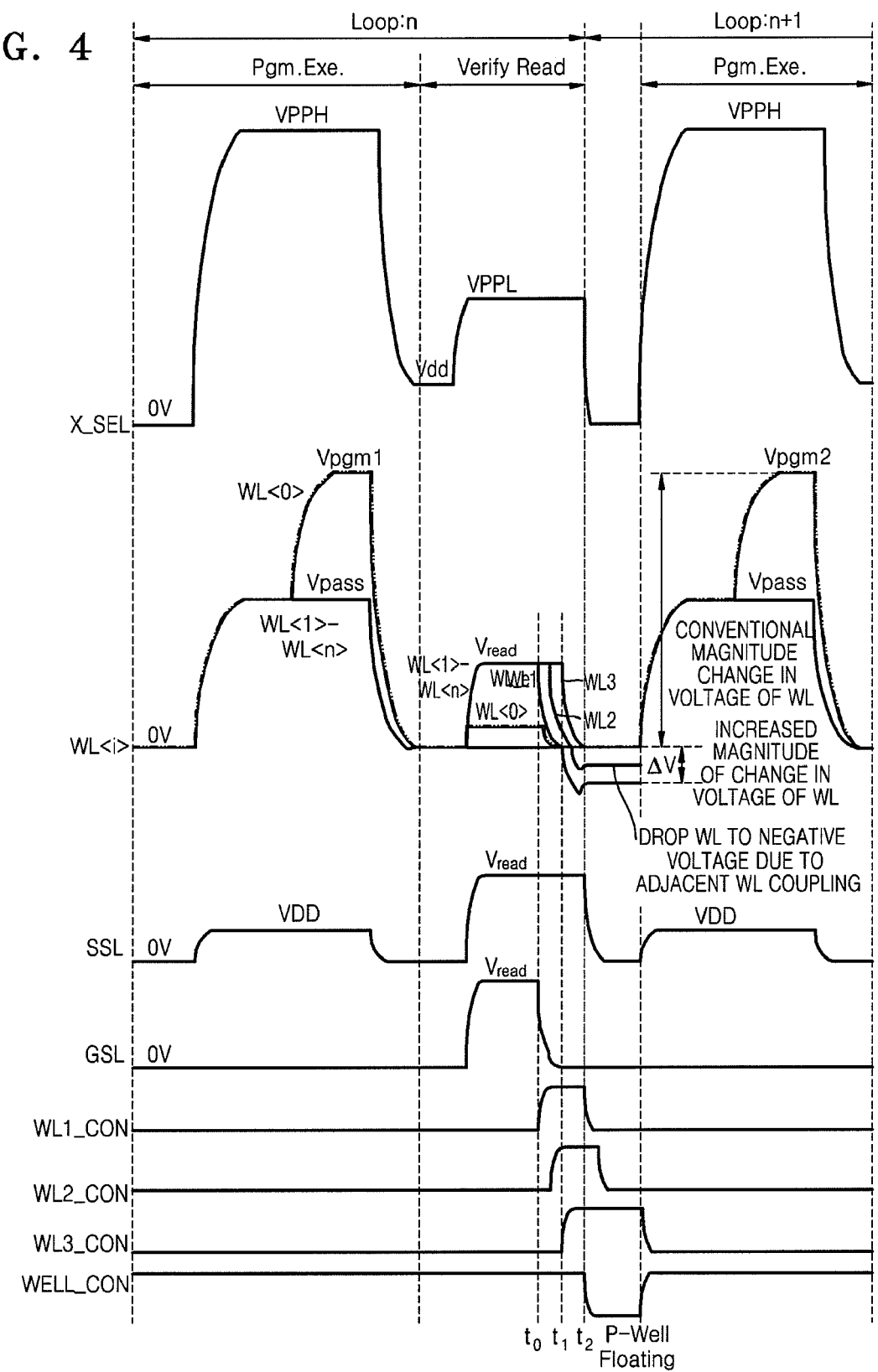
FIG. 4 is a timing diagram for explaining a method of applying a word line voltage during a program operation of the NAND flash memory device of FIG. 2, according to an exemplary embodiment of the inventive concept.

FIG. 4 is a timing diagram illustrating a method of applying a word line voltage during a program operation of the NAND flash memory device 200 of FIG. 2, according to an exemplary embodiment of the inventive concept. The method of FIG. 4 is different from the method of FIG. 3 in that between time $t_0$ and time $t_1$ of a verify and read step Verify Read, a first word line WL1, a second word line WL2, and a third word line WL3 are sequentially supplied with a ground voltage VSS. The first word line WL1, the second word line WL2, and the third word line WL3 are adjacent 3 word lines among the word lines WL<i> (0≦i≦n) of the memory cell array block 210 of FIG. 2 and are a basic unit of the method of FIG. 4.

At time $t_0$, the first word line WL1 is supplied with a ground voltage VSS in response to activation of a first word line control signal WL1_CON. Next, the second word line WL2 is supplied with a ground voltage VSS in response to activation of a second word line control signal WL2_CON. Accordingly, the first word line WL1 adjacent to the second word line WL2 is dropped to a negative voltage that is lower than the ground voltage VSS due to a coupling.

At time $t_1$, the third word line WL3 is supplied with a ground voltage VSS in response to activation of a third word line control signal WL3_CON. Accordingly, the second word line WL2 adjacent to the third word line WL3 is dropped to a negative voltage that is lower than the ground voltage VSS due to a coupling. In addition, the first word line WL1 adjacent to the second word line WL2 is further dropped to a lower negative voltage due to a coupling.

The word line WL<0> of the program inhibit cells of the method described above with respect to FIG. 4 has a high voltage change, which is greater than that of the word line WL<0> of the program inhibit cells of the method described above with respect to FIG. 3. This difference may be due to the double coupling, and accordingly, a channel voltage of the program inhibit cells may be increased more efficiently and the occurrence of a program disturbance of the program inhibit cells may be reduced or prevented.

While the inventive concept has been particularly shown and described with reference to exemplary embodiments thereof, it will be understood that various changes in form and details may be made therein without departing from the spirit and scope of the inventive concept.

What is claimed is:

1. A method of programming a selected memory cell of a memory cell array of a nonvolatile memory device in which a plurality of memory cells serially connected to a bit line constitute at least one cell string and are sequentially connected to a first word line, a second word line, and a third word line constituting a word line unit, the method comprising:
   driving, in a current program loop, a word line of the selected memory cell from among the first, second or third word line with a first program voltage;
   determining whether the selected memory cell is correctly programmed;
   sequentially driving the first word line with the first program voltage, the second word line with the first program voltage, and the third word line with the first program voltage; and
   when it is determined that the selected memory cell is not correctly programmed, the word line of the selected memory cell is driven with a second program voltage in a next program loop.

2. The method of claim 1 wherein the first program voltage is a ground voltage.

3. The method of claim 1, wherein, in the current program loop and the next program loop, a p-well formed by high voltage NMOS transistors, which apply corresponding driving voltages to the first through third word lines, is biased to a ground voltage.

4. The method of claim 1, wherein, after the first word line is driven by the first program voltage, the second word line is driven by the first program voltage, and then the third word line is driven by the first program voltage, a bias of a p-well formed by high voltage NMOS transistors, which transmit corresponding driving voltages to the first through third word lines, is floated.

5. The method of claim 1, wherein the second program voltage is higher than the first program voltage.

6. A method of programming a selected memory cell of a nonvolatile memory device, comprising:
   driving a word line of the selected memory cell with a first program voltage, wherein the word line of the selected memory cell is one of a first word line, a second word line or a third word line of the nonvolatile memory device;
   determining whether the selected memory cell has been correctly programmed;
   driving the first word line with the first program voltage;
   driving the second word line with the first program voltage, after driving the first word line;
   driving the third word line with the first program voltage, after driving the second word line; and
   when it is determined that the selected memory cell has not been correctly programmed, the word line of the selected memory cell is driven with a second program voltage.

7. The method of claim 6 wherein the first program voltage is a ground voltage.

8. The method of claim 6, wherein a p-well formed by high voltage NMOS transistors, which apply corresponding driving voltages to the first through third word lines, is biased to a ground voltage.

9. The method of claim 6, wherein, after the third word line is driven by the first program voltage, a bias of a p-well formed by high voltage NMOS transistors, which transmit corresponding driving voltages to the first through third word lines, is floated.

10. The method of claim 6, wherein the second program voltage is higher than the first program voltage.

* * * * *